United States Patent [19]

Davis

[11] Patent Number: 4,868,467

[45] Date of Patent: Sep. 19, 1989

[54] SELF-CALIBRATING SCANNER MOTOR DRIVER APPARATUS AND METHOD

[75] Inventor: Bruce M. Davis, Castle Rock, Colo.

[73] Assignee: Honeywell Inc., Minneapolis, Minn.

[21] Appl. No.: 144,254

[22] Filed: Jan. 14, 1988

[51] Int. Cl.[4] .............................................. H02P 7/06
[52] U.S. Cl. ..................................... 318/254; 318/439
[58] Field of Search ............... 318/254, 439, 138, 139, 318/341

[56] References Cited

U.S. PATENT DOCUMENTS

| 4,096,420 | 6/1978 | Gosling et al. | 318/254 |
| 4,520,296 | 5/1985 | Lepper et al. | 318/439 |
| 4,631,459 | 12/1986 | Fujioka et al. | 318/254 |
| 4,686,436 | 8/1987 | Archer | 318/254 |
| 4,703,235 | 10/1987 | Wisner | 318/254 |

OTHER PUBLICATIONS

Panasonic AG-6300 Service Manual (Order No. VRD-8305-406), vol. 1, pp. 1-64 through 1-67.

Primary Examiner—William M. Shoop, Jr.
Assistant Examiner—Brian Young
Attorney, Agent, or Firm—Kinney & Lange

[57] ABSTRACT

A driver circuit for a DC brushless motor of unknown characteristics operable to start and test to determine the desired characteristics and therefore to accurately and reliably run the motor.

17 Claims, 3 Drawing Sheets

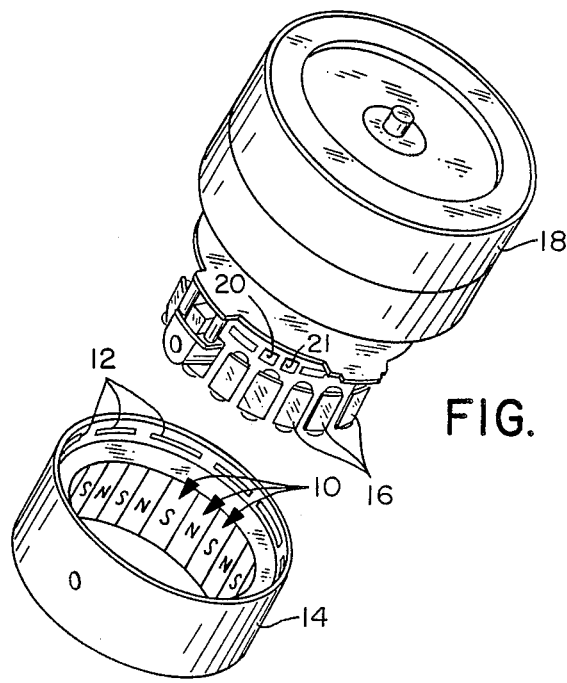
FIG. 1
FIG. 1a
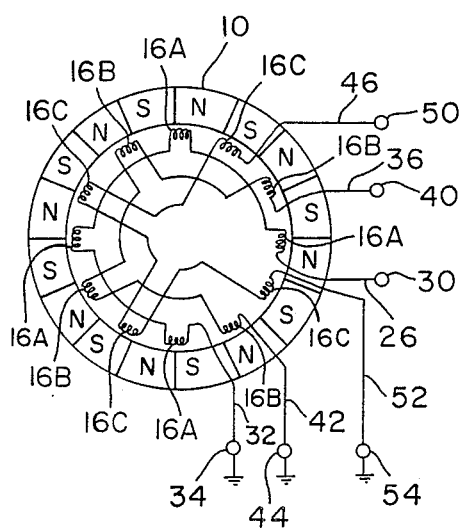
FIG. 2
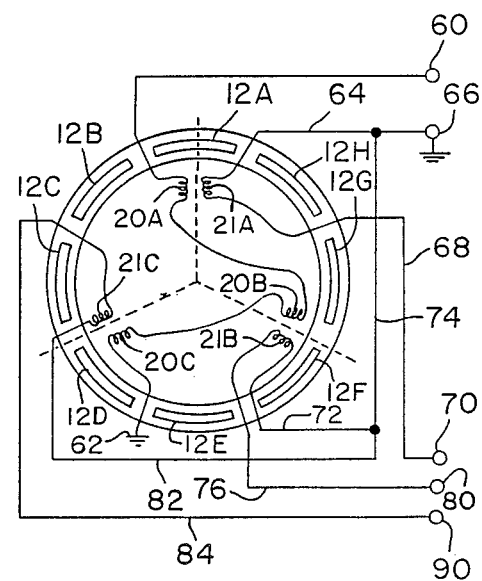
FIG. 3

SELF-CALIBRATING SCANNER MOTOR DRIVER APPARATUS AND METHOD

BACKGROUND OF THE INVENTION

1. Field of the Invention

The present invention relates to an apparatus and method for driving a motor whose characteristics are not known and more particularly to the driving of a transformer commutated brushless DC motor and especially one used for very large data storage in a rotary tape recorder.

2. Description of the Prior Art

When working with tape recorders for purposes of storing large amounts of data, a very accurate and constant drive motor is required. One form of such a motor is a transformer commutated brushless DC motor such as is sold by Panasonic in the AG-6300 Video Cassette Recorder. The Panasonic Video Cassette Recorder is accompanied by its own custom made integrated circuits to drive the scanner motor and since these integrated circuits are not readily available when the apparatus is modified for use in a very large data storage apparatus it is necessary that a driving circuit capable of starting and driving the motor be created with use of standard and inexpensive parts. Unfortunately without knowing the characteristics of the motor a problem arises in being able to start the motor since the magnetic nature of the motor is such that it may stall because of the placement of the magnetic poles with respect to the transformer windings. Also to run the motor reliably it is necessary to know the magnitude of the signals which are created by the position sensing coils, since without this knowledge control of the motor is difficult and sometimes impossible.

SUMMARY OF THE INVENTION

The present invention overcomes the problem by providing a self-calibrating driver circuit capable of beginning rotating under all conditions regardless of the relative position of the magnetic members and the transformer coils and for measuring the sensing coil voltages early in the process so as to compute the proper signal magnitudes and the proper phases for the transformers to provide continued rotary motion.

The present invention starts by driving the motor rotor through at least one complete cycle using predetermined and prephased voltages to the transformer windings. In this initial stage, the motor acts like a stepping motor and as the rotor rotates the position coils generate signals which are provided to a microprocessor and also to a comparator. The microprocessor operates to determine the levels of voltage generated by the position coils and from these levels to determine the DC level thereof. The voltage magnitude which exists at a slightly less than 30 degrees in the positive cycle of the output of the position coils. This slightly less than 30 degree signal is then presented to the comparators which compare the magnitude to the original position coil output so as to produce a square wave output from the comparators which is properly phased and slightly overlapping to thereafter drive the motor in a reliable fashion.

BRIEF DESCRIPTION OF THE DRAWINGS

FIG. 1 and FIG. 1A show an exploded view of a transformer commutated brushless DC motor;

FIG. 2 shows schematically the arrangement of the magnetic poles and the transformer coils for the motor of FIG. 1;

FIG. 3 shows schematically the arrangement of the position sensor coils and a plurality of rotary apertures;

DETAILED DESCRIPTION OF THE PREFERRED EMBODIMENTS

Figure 4:
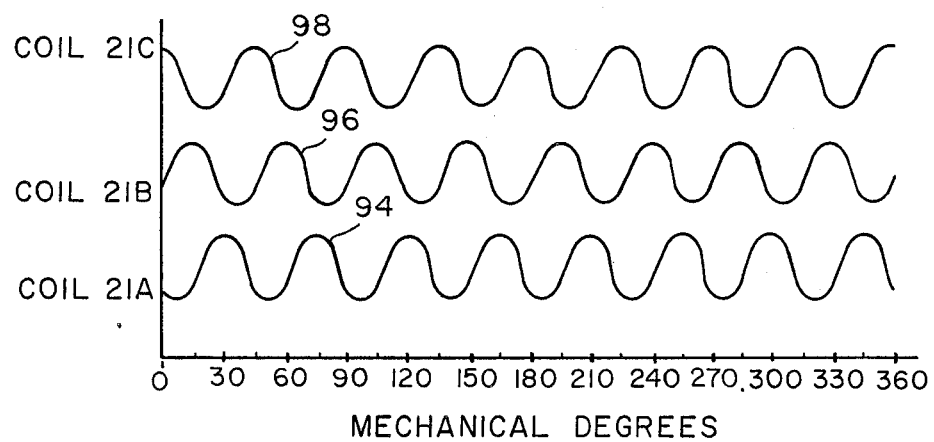
FIG. 4 is a graph showing the relative outputs of the position sensing coils.

FIG. 1 shows a direct-drive DC brushless motor of the kind used by Panasonic in their above referred to AG-6300 Video Cassette Recorder. This kind of motor is high in reliability, accuracy and durability and accordingly is excellent for use in very large data systems employing video tape for storing digital information thereon.

Although the number of poles is a matter of design choice, this motor includes a 16-pole ring magnet identified by reference numeral 10 comprising permanent magnets which are alternately poled north and south and arranged in a circular fashion. Above the ring magnet 10 a plurality of apertures, or "windows," identified by reference numeral 12 are arranged concentrically around the upper edge of an encircling member 14 around the ring magnet 10.

A plurality of transformer coils such as identified by reference numeral 16 are mounted on the lower end of a stator member 18 and are mounted in a circular arrangement so as to fit within the circular structure of the ring magnet 10. Three pairs of position sensing coils such as those identified by reference numerals 20 and 21 are mounted on the stator member 18 above and spaced around the transformer coils 16. Position coils 20 and 21 are situated such as to be adjacent the windows 12 in the rotor member 14 when the motor is assembled.

While in the preferred embodiment, the ring magnet consists of 16 individually poled magnets cooperating with 12 main coils, and three position sensing coil arrangements are shown cooperating with eight windows, other arrangements are possible and the numbers are a matter of design choice. With the arrangement shown in the preferred embodiment, the 12 coils may be connected together into three sets of four coils each, each set being so mechanically positioned as to cause rotation of the ring magnets when the coils are sequentially energized in a manner to be explained in more detail hereinafter.

Also with the arrangement shown in preferred embodiment wherein the number of windows in the rotor member 14 is eight and the number of position coil pairs 20-21 is three, the eight windows will continually pass by the three stationary position coil pairs in a three phase manner, i.e. all three coil pairs being 120 mechanical degrees apart will be exactly adjacent a window at different points every 15 degrees of rotation. As the window passes over a coil, magnetic coupling transfers less energy into the secondary winding than is the case when the window is not present with the result that every secondary winding will have an amplitude modulated signal presented at its terminals which is 15 degrees out of phase with its neighbor, as will be more clearly seen in connection with FIG. 3.

In practice, stator 18 is mounted with respect to rotor 14 so that the coils 16 are closely adjacent to the magnets of ring 10, and the position coils 20 and 21 are proximate the windows 12. The apparatus is then connected in the recording device (not shown) and positioned so as to rotate at an angle with respect to the tape passing proximate the surface of the rotor 14 to thereby leave a recording of digital signals thereon. Such tape transport mechanisms are well known in the art and will not be further described herein.

FIG. 2 shows a top view of the ring magnet 10 and the 16 magnets alternately poled south and north arranged in circular fashion. The main coils 16 are shown to be connected in three sets of four coils each identified by reference numerals 16A, 16B, and 16C, respectively. One end of the coil set 16A is connected by a conducter 26 to an input terminal 30 to receive a positive voltage thereon. The other end of the set of coils 16A is connected by a conducter 32 to an output terminal 34 which is connected to signal ground. In similar fashion, a first end of the set of coils 16B is connected by a conductor 36 to an input terminal 40 to receive a positive voltage, and the other end of set 16B is connected by a conductor 42 to an output terminal 44 also connected to signal ground. Similarly, one end of the coil set 16C is connected by a conductor 46 to an input terminal 50 to receive a positive voltage, and the other end of coil set 16C is connected by a conductor 52 to an output terminal 54 connected to signal ground.

It will be appreciated that with 12 coils and 16 magnets there will be displacement between some of the coils and the center of some of the magnets in all cases. For example, in FIG. 2 the set of coils identified as 16A are all shown closely adjacent to a dividing line between a south and north poled magnet, coil set 16B is shown to be adjacent and slightly to the right of the center line of corresponding north poled magnets, and coil set 16C is shown to be slightly to the left of center of south poled magnets. Accordingly, if two of the three sets of main coils are sequentially actuated by voltages applied to two of the terminals 30, 40 and 50, a magnetic field will be created in a rotating direction and the ring magnet 10 will follow. As soon as the magnet moves to follow, its position will be sensed by the apparatus to be described in connection with FIG. 3 and a different set of main coils will be activated to keep the rotation going. As the motor rotates, the position sensing transformers, such as 20 and 21, will continually pass by the windows such as 12 to provide the signals indicative of position.

In FIG. 3, eight windows identified by reference numerals 12A-12H are shown equally spaced around in a circle 45 degrees apart from one another. Three primary transformer windings identified by reference numerals 20A, 20B, and 20C are shown connected in series between an input terminal 60 and a ground connection 62. Alternately windings 20A, 20B, & 20C may be wired in parallel. One end of a first secondary winding 21A is connected by conductor 64 to a grounded terminal 66 and the other is connected by a conductor 68 to a terminal 70. Similarly, one end of a second secondary 21B is connected by a conductor 72 and a conductor 74 to terminal 66 and the other end is connected by a conductor 76 to a terminal 80. In like fashion, one end of a third secondary winding 21C is connected by a conductor 82 and conductor 74 to terminal 66 and the other end is connected by a conductor 84 to a terminal 90.

It will be appreciated that the primary windings are energized from a source of alternating signals such as a 65 kHz sinusoidal signal from terminal 60 to signal ground 62. Signals will be sensed by secondaries 21A, 21B, and 21C so as to produce outputs between terminals 66 and terminals 70, 80 or 90, respectively. The magnitude of these signals will depend upon the position of the transformers with respect to the windows 12A-12H. More particularly as the window passes over a coil the magnetic coupling of the transformers between primary coils 20A, 20B, and 20C and secondary coils 21A, 21B, and 21C will transfer less energy to the secondary windings than is the case when the window is not present with the result that every secondary winding will have an amplitude modulated 65 kHz signal present at its terminal. In the preferred embodiment the motor will spin at approximately 30 Hz (1800 rpm) so that each coil will see eight windows per revolution and will produce a 240 Hz amplitude modulated output signal. It will be noted that the coils are physically separated at 120 degree positions around the circle and accordingly the 240 Hz output of the three secondaries will be 120 degrees apart from each other. Every time the motor turns by 15 mechanical degrees, one of the secondaries will deliver a maximum output. The actual wave form produced by the secondaries will be 240 Hz envelopes modulated on the 65 kHz carrier. When such signals are AM detected, the carrier will be eliminated and just the 240 Hz signal remain as seen in FIG. 4.

Referring to FIG. 4, the output of the three coils 21A, 21B and 21C is shown as three 120 degree out of phase curves 94, 96, and 98, respectively. It is seen that each coil peaks eight times in the 360 degrees of mechanical rotation and that each curve peaks at a different point separated from its neighbor by 15 mechanical degrees.

Figure 5:
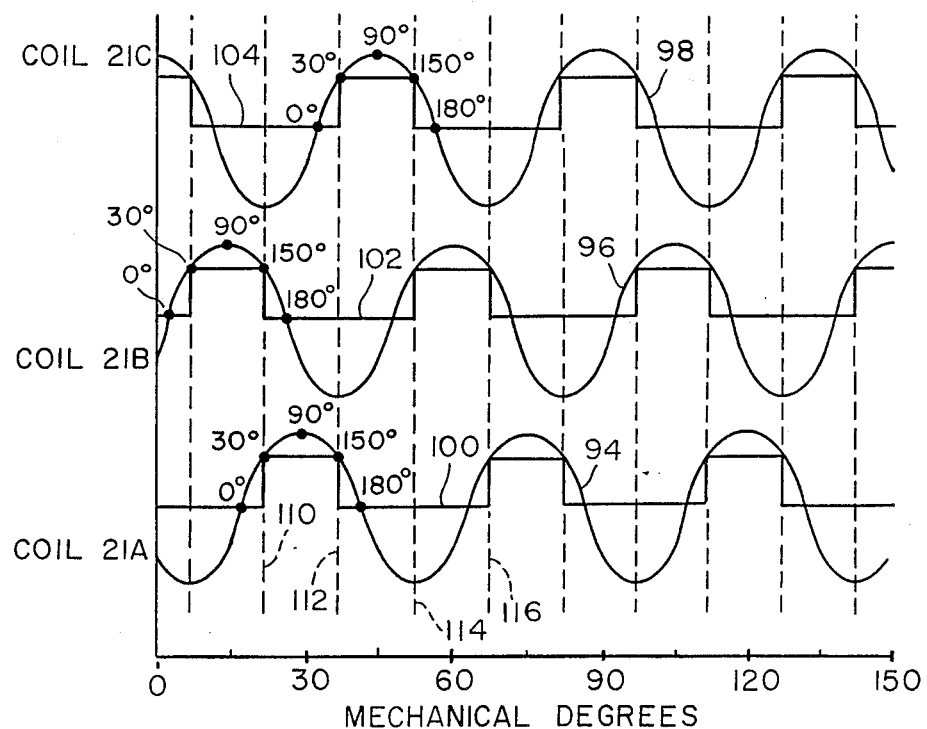
FIG. 5 is a graph showing the arrangement of the 30 degree voltages on the outputs of the sensing coils.

An enlarged set of curves 94, 96, and 98 is shown in FIG. 5 over 150 mechanical degrees of motion. In FIG. 5, three square waves are generated from the positions of coils 21A, 21B and 21C as shown by curves 100, 102, and 104, respectively. Square wave 100 is produced by providing a low voltage represented by the lower part of curve 100 whenever the instantaneous magnitude of curve 94 has a value less than its value would be at an electrical 30 degrees in the sine wave. Accordingly, curve 100 is shown rising to a high value between the 30 and 150 degree positions of sine wave 94 and falling to a low level at other times. Similarly, curve 102 rises to a high value between the 30 degree and 150 degree positions of sine wave 96 and is at a low level at other times, and curve 104 rises to a high level between the 30 degree and 150 degree portions of sine ave 98 and falls to a low level at all other times. It will be noted in FIG. 5 that when curve 100 just rises to a high value along a dash line 110, for example, curve 102 has just fallen to a low level and curve 104 is halfway through its low level cycle. When curve 100 falls to a low level along a dash line 112, curve 102 is halfway through its low level portion and curve 104 has just risen to a high level. When curve 104 returns to a low level along a dash line 114, curve 102 just rises to a high level and curve 104 is halfway through its low level position. Finally, when curve 102 falls to a low level along a dash line 116, curve 100 again rises to a high level while curve 104 is halfway through its low level position. Thus, for every electrical cycle of any one of the coils a high level signal is presented for one-third of the time by each of the coils 120 electrical degrees apart. This is seen in FIG. 5 to be every 15 mechanical degrees starting with curve 102 rising to a high level at approximately seven and a half mechanical degrees of rotation.

If the signals 100, 102, and 104 were to be presented to the main coil winding 16A, 16B, and 16C of FIG. 2, a rotating field would be set up which would cause the ring magnets 10 to rotate and keep rotating.

Figure 6:
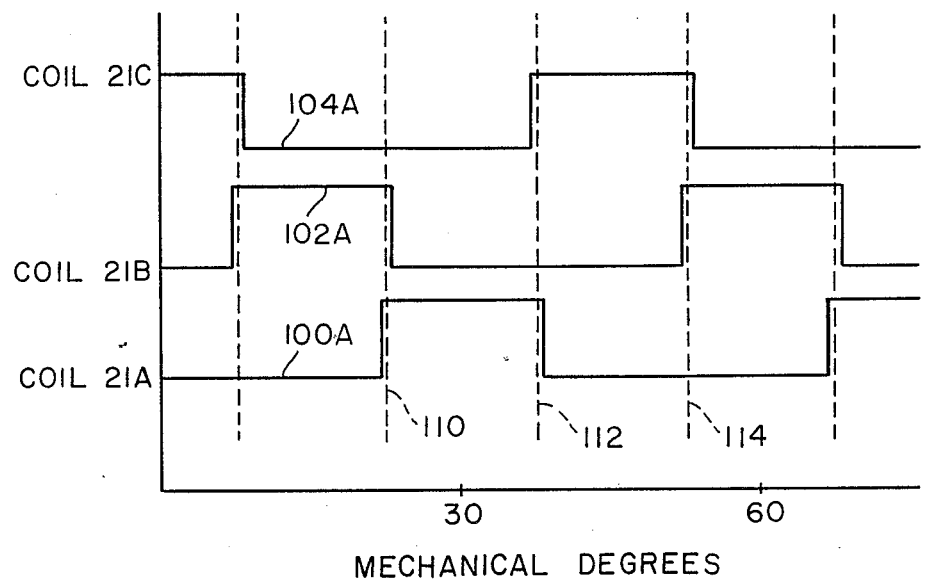
FIG. 6 is a graph showing the square wave and overlap arrangement generated by the comparators.

In the arrangement thus far described, there is a possibility that the curves 100, 102, and 104 might rise to a high level at a point slightly after the 30 degree point and/or fall to a low level at a point slightly before the 150 degree point, in which event a hiatus would occur between the ending of one of the curves and the beginning of the next, and the coils would receive no signal which might cause the system to fail. To overcome this problem, a point slightly less than the 30 degree point and slightly greater than the 150 degree point on each of the curves 94, 96, and 98 is chosen so that there will be a slight overlap. This situation is shown in FIG. 6 wherein the square waves generated from the outputs of coils 21A, 21B and 21C are again shown as curves 100A, 102A, and 104A, respectively. It is seen that curve 100A now rises slightly to the left of dash line 110 and that curve 102A falls to a low level at point slightly to the right of dash line 110. Similarly, curve 104A rises to a high value at a point slightly in advance of dash line 112 while curve 100A falls to a low value at a point slightly to the right of dash line 112. Likewise, curve 102A rises to a high value at a point slightly to the left of dash line 114 while curve 104A falls to a low level at a point just to the right of dash line 114. It is thus seen that if there are errors that cause slight misalignments of the 30 degree point and 150 degree point, the overlapping will assure that there is a signal at all times to the coils 16A, 16B, and 16C of FIG. 2.

In order to produce the curves 100, 102, and 104 in FIG. 5, and more particularly curves 100A, 102A and 104A in FIG. 6, it is necessary to know where the 30 degree and 150 degree points are on curves 94, 96, and 98. However, when the characteristics of the motor are not known in advance, the magnitudes of the voltages from coils 21A, 21B and 21C are not known and without this it is not possible to determine the 30 degree and 150 degree points. Accordingly in the present invention provisions are made for measuring the voltages produced by the coils 21A, 21B and 21C at an early stage in the operation thereof. More particularly at the start of operation of the motor, predetermined fixed signals are presented to coils 16A, 16B, and 16C in a predetermined sequence which causes the ring magnets 10 to move in a step motor fashion from one position to another. As it moves, the output voltages from the sensing coils 21A, 21B, and 21C are measured so as to determine the maximum and minimum values of the curves of FIG. 5. When the maximum and minimum values of each curve are known, the DC level of the midpoint of the curves can be obtained from the equation:

$$V_{dc} = \frac{V_{max} + V_{min}}{2} \quad (1)$$

The 30 degree point on a sinusoidal curve is one-half the value from the midpoint to the maximum or one-quarter of the value between the maximum value and the minimum value. The resultant desired 30 degree trip point for the system is therefore determined by the sum of these two values or $$V_{30} = \frac{V_{max} + V_{min}}{2} + \frac{V_{max} - V_{min}}{4} \quad (2)$$

Thus, the computer can calculate the 30 degree and 150 degree trip points from equation (2) and then, in order to provide the overlap described in connection with FIG. 6, a small amount, say 2% or a little more, is then subtracted from this value so that the square pulses are widened slightly, as in FIG. 6, to provide the desired overlap. In the use of the above mentioned Panasonic motor, the voltage $V_{30}$ is usually somewhere around 3 volts and the amount subtracted therefrom to create the overlap situation is approximately 0.08 volts.

After the above values for the trip point at $V_{30}$ are calculated, which usually takes about one and one-half rotations of rotor 10 in order to be sure of the values, the motor can thereafter be driven by these signals generated as curves 100A, 102A, and 104A in FIG. 6. The operation of the circuit for producing these results will be described in connection with FIG. 7.

Figure 7:
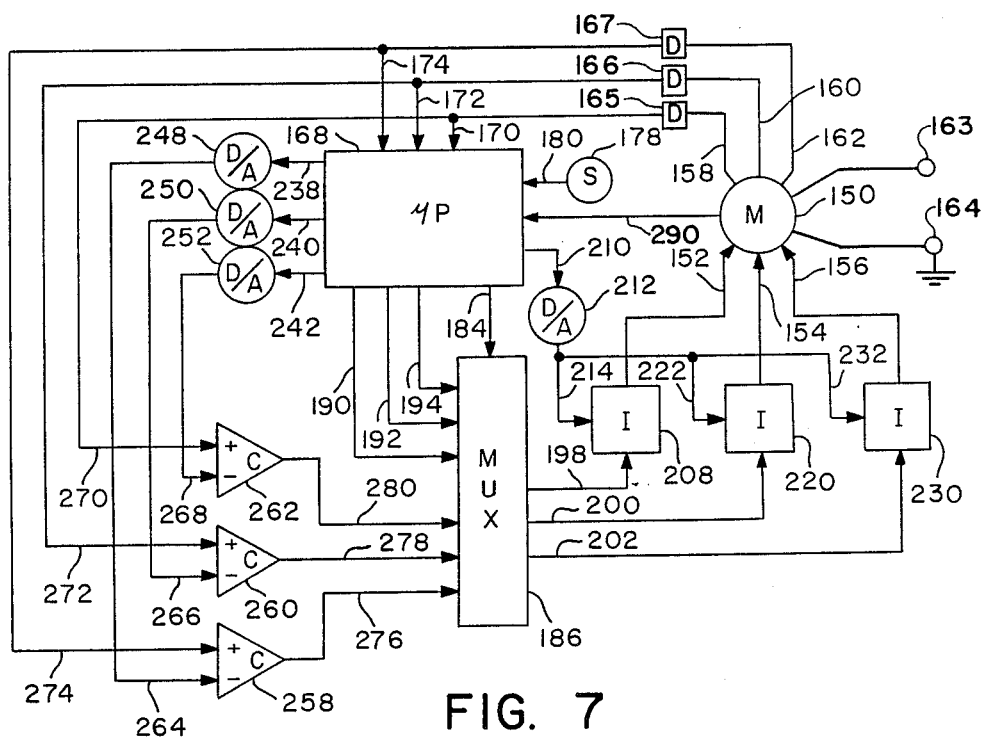
FIG. 7 is a schematic block diagram of the circuit of the present invention.

In FIG. 7, the motor to be controlled is shown by reference numeral 150 having input connections shown as arrows 152, 154 and 156 used to provide signals to terminals 30, 40 and 50, respectively, in FIG. 2. Motor 150 also has output connections 158, 160 and 162 representing the outputs from terminals 70, 80 and 90, respectively, in FIG. 3. The carrier frequency input 60 and ground connection 66 of FIG. 3 are shown as terminals 163 and 164, respectively, in FIG. 7. The output connections 158, 160 and 162 are presented through detectors 165, 166 and 167, respectively, to a microprocessor 168 through connections shown as arrows 170, 172 and 174, respectively. The detectors 165, 166 and 167 remove the carrier frequency outputs 158, 160 and 162, respectively, so as to produce signals like those shown in FIG. 4 to microprocessor 168. The microprocessor 168 is shown connected to a switch 178 by a connection shown as arrow 180 which operates to energize the microprocessor when it is desired to turn the motor 150 on.

Microprocessor 168 has a first output shown by an arrow 184 connected to a multiplexer 186 and a signal thereon causes the multiplexer 186 to switch between first and second conditions. In the first condition, multiplexer 186 operates to connect a triad of outputs shown as arrows 190, 192 and 194 from microprocessor 168 to multiplexer 186 to a triad of outputs shown as arrows 198, 200 and 202 from multiplxer 186. Output 198 is connected to a first current generator 208 which is also seen receiving a signal from microprocessor 168 through a connection shown as arrow 210, a digital-to-analog converter 212 and a connection shown as arrow 214. The output of current generator 208 is shown connected to the input 152 of motor 150. In operation, the output of the current generator 208 is controlled on or off by the signal on input 198 from the multiplexer 186 which receives the signal from the microprocessor (during initial start-up) over the connection 190. The magnitude of the current from generator 208 is controlled from microprocessor 168 via the connections 210, digital-to-analog converter 212 and connection 214. Accordingly, at start-up, microprocessor 168 generates a predetermined voltage signal on connection 210 which is passed through the digital-to-analog computer 212 to connection 214 so that current generator 208 supplies a current signal of predetermined magnitude to motor 150 over connection 152 when called for by the signal on line 198. Similarly, output 200 of multiplexer 186 is connected to a second current generator 220 which receives a second input from microprocessor 168 via output connection 210, digital-to-analog converter 212 and a connection shown as arrow 222. The output of current generator 220 provides the input to motor 150 via connection 154. Accordingly, at start-up condition, microprocessor 168 sends the predetermined voltage signal on connection 210 which is passed through digital-to-analog converter 212 to connection 222 so that current generator 220 supplies a predetermined current signal on connection 154 to motor 150 when called for by the signal on line 200. Similarly, output 202 of multiplexer 186 is connected to the input of a third current generator 230 which is shown receiving a second input from microprocessor 168 via output connection 210, digital-to-analog converter 212 and a connection shown as arrow 232. The output of current generator 230 is connected to motor 150 by connection 156. Accordingly, at start-up, microprocessor 168 sends the predetermined voltage signal on connection 210 through digital-to-analog converter 212 to line 232 so that current generator 230 supplies a predetermine current signal to motor 150 via connection 156 when called for by a signal on output 202 of multiplexer 186. The outputs of microprocessor 168 on connections 190, 192 and 194 are phased so as to provide a stepping driving force to motor 150 to cause it to turn from one position to another as has been described above. When this occurs, the signals generated by coils 21A, 21B and 21C of FIG. 3 will appear on lines 158, 160 and 162 from motor 150 of FIG. 7 and after the carrier frequency is removed by detectors 165, 166 and 167 are presented to microprocessor 168 via connections 170, 172 and 174. Microprocessor 168 now may determine the maximum and minimum values generated by the pickup coils 21A, 21B and 21C and to determine therefrom the desired trip point $V_{30}$ as described in connection with equation (2) above less an approximate 2% to provide the overlap of FIG. 6. These desired trip point voltages are generated by microprocessor 168 over output connections shown by arrows 238, 240 and 242 which are seen connected to digital-to-analog converters 248, 250 and 252, respectively. The outputs of digital-to-analog converters 248, 250 and 252 are connected to the negative inputs of three comparators 258, 260 and 262 by connections shown as arrows 264, 266 and 268, respectively. Comparators 258, 260 and 252 each have a positive input connected respectively to detectors 167, 166 and 165 by connections shown as arrows 270, 272 and 274, respectively. Comparators 258, 260 and 262 are also shown having outputs connected to the multplexer 186 by connections shown as arrows 276, 278 and 280, respectively. The purpose of comparators 258, 260 and 262 is to produce an output on connections 276, 278 and 280 indicative of the difference between the positive and negative inputs they receive. Accordingly, when the trip point value $V_{30}$ less 2% is determined by microprocessor 168, a voltage representative thereof appears on the negative input terminals 264, 266 and 268. The positive input terminals are receiving the detected output of motor 150 from the sensing coils 21A, 21B and 21C over connections 270, 272 and 274, respectively. Therefore, the output of comparators 258, 260 and 262 will be zero until such time as the positive input exceeds the negative input, which corresponds to the trip point determined by microprocessor 168. Accordingly, an output will appear on each of the comparators 258, 260 and 262 only during the time between the 30 degree point and the 150 degree point (less the approximate 2% needed for overlap) on lines 276, 278 and 280 respectively.

After microprocessor 168 has determined the values of the trip points for each of the coils, a signal will be presented along output 184 to multiplexer 186 which will thereafter switch to the second condition and the outputs 276, 278 and 280 from comparators 258, 260 and 262 will pass through multiplexer 186 to outputs 198, 200 and 202. As explained above, these outputs operate through current generators 208, 220 and 230 to drive motor 150.

A connection shown as arrow 290 is shown from motor 150 to microprocessor 168. This connection may be used to provide a signal from motor 150 to microprocessor 168 periodically as the rotor 14 rotates. The speed of this signal is indicative of the motor speed so that microprocessor 168 can determine when the motor is operating at a full desired speed. At this time, the signals to the motor can then be recalibrated to maintain the desired speed.

It is accordingly seen that I have provided a circuit which can operate a DC brushless motor even though its characteristics are unknown and to provide positive and reliable start-up procedures to make sure that the motor does not stall either during start-up or running.

Although the present invention has been described with reference to preferred embodiments, workers skilled in the art will recognize that changes may be made in form and detail without departing from the spirit and scope of the invention.

What is claimed is:

1. Drive means for a motor, the motor having first, second and third input means for receiving first, second and third driving input signals, respectively, and the motor having first, second and third output signals which vary between maximum and minimum values with the rotation of the motor, comprising:

processing means connected to receive the first, second and third output signals and to produce therefrom first, second and third reference signals which vary in magnitude according to a predetermined function of the difference between the maximum and minimum value of the first, second and third output signals, respectively;

comparator means connected to receive the first, second and third output signals, respectively, and to receive the first, second and third reference signals, respectively, and to produce therefrom first, second and third derived signals which vary in magnitude with the comparative values of the first, second and third output signals and the first, second and third reference signals; and connection means connecting the comparator means to the first, second and third input means so that the first, second and third derived signals supply the first, second and third driving input signals, respectively.

2. Apparatus according to claim 1 wherein the motor is a DC brushless motor, the first, second and third input means include first, second and third driving coils and the first, second and third output signals are varying voltages obtained from first, second and third sensing coils.

3. Apparatus according to claim 2 wherein the processing means includes a microprocessor to calculate the first, second and third reference signals based on a function of the maximum and minimum values of the varying voltages.

4. Apparatus according to claim 3 wherein the function is $$\frac{V_{max} + V_{min}}{2} + \frac{V_{max} - V_{min}}{4}$$

where $V_{max}$ is the maximum value of the varying voltages and $V_{min}$ is the minimum value of the varying voltages.

5. Apparatus according to claim 4 wherein the comparator means includes first, second and third comparators each having a negative input terminal connected to the microprocessor to receive the first, second and third reference signals, respectively, and a positive input terminal connected to the motor to receive the first, second and third output signals, respectively, and wherein the first, second and third derived signals vary with the difference in magnitude between the signals a the positive and negative input terminals, respectively.

6. Apparatus according to claim 5 wherein the connection means includes a multiplexer operable to connect the outputs of the first, second and third comparators to the first, second and third input means of the motor, respectively.

7. Apparatus according to claim 1 wherein, during a predetermined start-up period of the motor, the processing means is operable to provide first, second and third predetermined magnitude signals and the connection means connects the first, second and third predetermined magnitude signals to the first, second and third input means, respectively.

8. Apparatus according to claim 7 wherein the connection means includes a multiplexer connected to the processing means and operable in accordance with a first select signal produced by the means at the start of the predetermined start-up period to connect the first, second and third predetermined magnitude signals to the first, second and third input means and during the predetermined start-up period the processing means determines the first, second and third reference signals and thereafter the processing means produces a second select signal to the multiplexer which then connects the first, second and third input means of the motor to the comparator means to receive the first, second and third derived signals.

9. Apparatus according to claim 8 wherein the motor is a brushless DC motor, the first, second and third input means include first, second and third driving coils and the first, second and third output signals are varying voltages obtained from the first, second and third sensing coils.

10. Apparatus according to claim 9 wherein the processing means includes a microprocessor to calculate the first, second and third reference signals from the varying voltages according to the equation $$\frac{V_{max} + V_{min}}{2} + \frac{V_{max} - V_{min}}{4}$$

where $V_{max}$ is the maximum value of the varying voltages and $V_{min}$ is the minimum value of the varying voltages.

11. The method of controlling a motor having first, second and third driving inputs and first, second and third motor condition outputs which vary in magnitude with the rotation of the motor comprising the steps of:
   a. supplying first, second and third predetermined driving signals to the first, second and third driving inputs for a predetermined time to cause the motor to operate during the predetermined time and generate the first, second and third motor condition outputs;
   b. computing from the first, second and third motor condition outputs, first, second and third reference signals which vary in magnitude with a predetermined function of the variation in the magnitude of the motor condition outputs;
   c. comparing the first, second and third motor condition outputs with the first, second and third reference signals to produce first, second and third derived driving signals which vary in magnitude with the relative magnitude of the motor condition outputs and the reference signals, respectively; and
   d. supplying the first, second and third derived driving signals to the first, second and third driving inputs after the predetermined time to cause continued operation of the motor.

12. The method of claim 11 wherein the first, second and third motor condition outputs comprise varying voltages having a maximum value, $V_{max}$, and a minimum value, $V_{min}$, and step b computes the first, second and third references signals from a function of $V_{max}$ and $V_{min}$.

13. The method of claim 12 wherein the function is $$\frac{V_{max} + V_{min}}{2} + \frac{V_{max} - V_{min}}{4}$$

14. The method of claim 11 wherein the motor is a DC brushless motor having first, second and third driving coils and in step a the first, second and third predetermined driving signals are supplied to the first, second and third driving coils, respectively.

15. The method of claim 14 wherein the motor includes first, second and third position sensing coils which generate varying voltages comprising the first, second and third motor condition outputs and step b includes deriving the first, second and third reference signals from the varying voltages.

16. The method of claim 15 wherein step b includes determining the first, second and third reference signals from the equation $$\frac{V_{max} + V_{min}}{2} + \frac{V_{max} - V_{min}}{4}$$

where $V_{max}$ is the maximum value of the varying voltages and $V_{min}$ is the minimum value of the varying voltages.

17. The method of claim 16 wherein step c includes obtaining the difference between the first motor condition signal and the first reference signal to produce the first derived driving signal, obtaining the difference between the second motor condition signal and the second reference signal to produce the second derived driving signal, and obtaining the difference between the third motor condition signal and the third reference signal to produce the third derived driving signal.

* * * * *

UNITED STATES PATENT AND TRADEMARK OFFICE
CERTIFICATE OF CORRECTION

PATENT NO. : 4,868,467

DATED : September 19, 1989

INVENTOR(S) : Bruce M. Davis

It is certified that error appears in the above-identified patent and that said Letters Patent is hereby corrected as shown below:

Column 9, line 23, delete "a" and insert --at--.

Column 9, line 39, after "by the" insert --processing--.

Signed and Sealed this

Eleventh Day of September, 1990

Attest:

HARRY F. MANBECK, JR.

*Attesting Officer*  *Commissioner of Patents and Trademarks*